United States Patent [19]

Kosaki

[11] Patent Number: 5,483,092
[45] Date of Patent: Jan. 9, 1996

[54] SEMICONDUCTOR DEVICE HAVING A VIA-HOLE WITH A VOID AREA FOR REDUCED CRACKING

[75] Inventor: Katsuya Kosaki, Itami, Japan

[73] Assignee: Mitsubishi Denki Kabushiki Kaisha, Tokyo, Japan

[21] Appl. No.: 444,520

[22] Filed: May 19, 1995

Related U.S. Application Data

[63] Continuation of Ser. No. 200,485, Feb. 23, 1994, abandoned.

[30] Foreign Application Priority Data

Jun. 24, 1993 [JP] Japan .................................. 5-153111

[51] Int. Cl.$^6$ ......................... H01L 29/80; H01L 31/112
[52] U.S. Cl. ........................ 257/276; 257/774; 257/766
[58] Field of Search .................................. 257/276, 728, 257/625, 766, 774, 773

[56] References Cited

U.S. PATENT DOCUMENTS 4,268,849   5/1981   Gray et al. .............................. 257/766

FOREIGN PATENT DOCUMENTS

| | | |
|---|---|---|
| 2162735 | 12/1988 | European Pat. Off. . |
| 268562A | 5/1989 | Germany .................. 257/766 |
| 1162735 | 6/1990 | Japan . |
| 2-162735 | 6/1990 | Japan . |
| 9111833 | 1/1991 | WIPO . |

OTHER PUBLICATIONS

Gouldan et al, "Method For Producing Via–Connections in Semiconductor Wafers Using a Combination of Plasma and Chemical Etching", IEEE Transactions on Electrom Devices, vol. ED–30, No. 10, Oct. 1983, pp. 1402–1403.
Pavio et al, "GaAs MMIC Evaluation Of Via Fracturing", IEEE GaAs IC Symposium, 1988, pp. 305–307.
Ozaki, "Method For Preventing Via–Hole Crack", Transactions of Engineering, 1991.

*Primary Examiner*—Sara W. Crane
*Assistant Examiner*—John Guay
*Attorney, Agent, or Firm*—Leydig, Voit & Mayer

[57] ABSTRACT

A semiconductor device including a conductive pad and a semiconductor chip soldered to the conductive pad, the semiconductor chip including a substrate having opposite front and rear surfaces, a first electrode disposed on the front surface, a dome-shaped via-hole having an opening at the rear surface of the substrate and a bottom in contact with the first electrode, and a second electrode covering the rear surface of the substrate and the internal surface of the via-hole. The semiconductor chip is soldered to the conductive pad so that a space is formed between the internal surface of the via-hole and the solder. The space has a distance d from the bottom of the via-hole in a direction perpendicular to the front surface of the substrate represented by $$d = \frac{xE_2[\{\Delta T(\alpha_1 - \alpha_2)/y\} - (1/E_1)]}{1 + E_2[\{\Delta T(\alpha_1 - \alpha_2)/y\} - (1/E_1)]}$$

where x is the via-hole depth, y is rupture stress of the semi-conductor substrate, $E_1$ is Young's modulus of a semiconductor substrate, $E_2$ is Young's modulus of the solder, $\alpha_1$ is the linear thermal expansion coefficient of the semiconductor substrate, $\alpha_2$ is the linear thermal coefficient of the solder, and $\Delta T$ is the difference between the die-bonding temperature at which the semi-conductor substrate is soldered to the conductive pad and room temperature.

4 Claims, 17 Drawing Sheets

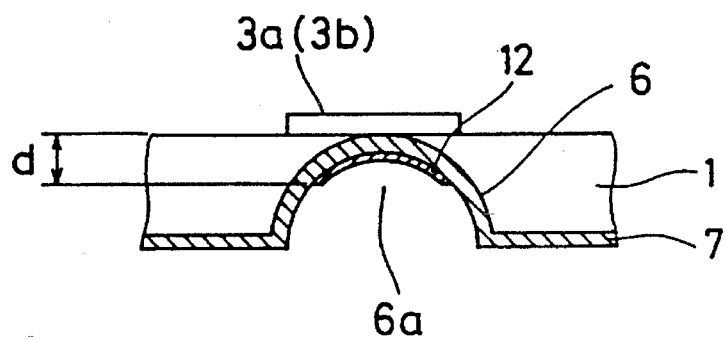
FIG.2(a)
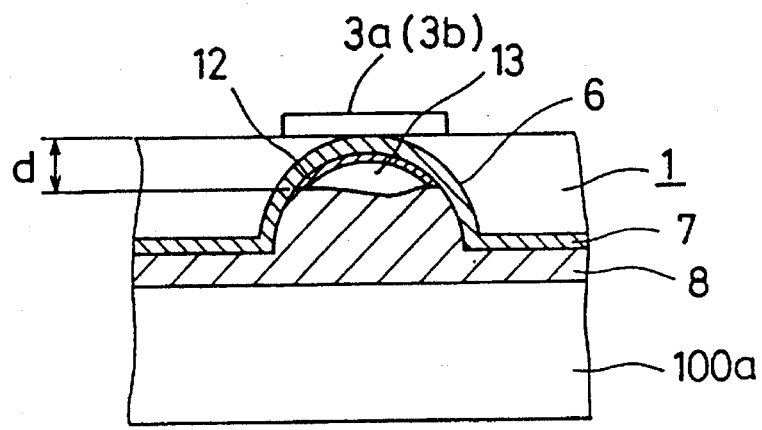
FIG.2(b)
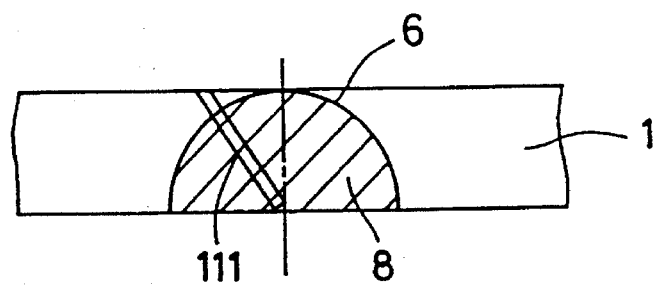
FIG.3
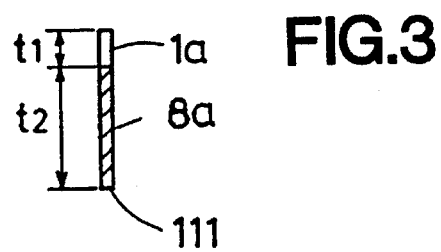

5,483,092

SEMICONDUCTOR DEVICE HAVING A VIA-HOLE WITH A VOID AREA FOR REDUCED CRACKING

This disclosure is a continuation of application Ser. No. 08/200,485, filed Feb. 23, 1994, now abandoned.

FIELD OF THE INVENTION

The present invention relates to a semiconductor device including a semiconductor substrate having opposite front and rear surface and grounding via-holes penetrating through the semiconductor substrate from the rear surface. The invention also relates to a method for producing the semiconductor device.

BACKGROUND OF THE INVENTION

FIGS. 19(a) is a plan view of a prior art semiconductor device including a high-frequency and high-output GaAs field effect transistor (hereinafter referred to as GaAs FET), and FIG. 19(b) is a sectional view taken along line 19b—19b of FIG. 19(a). In these figures, a semiconductor device 500 comprises a die pad 500a having a surface plated with Au or the like and a GaAs FET chip 500b soldered to the surface of the die pad 500a using AuSn solder 8.

The GaAs FET chip 500b includes a GaAs substrate 1 having opposite front and rear surfaces. An n type active layer 2 is disposed within the GaAs substrate 1 reaching the front surface. Spaced apart source electrodes 3a and 3b comprising an Au-containing alloy are disposed on the front surface of the substrate 1. A drain electrode 4 comprising an Au-containing alloy and a gate electrode 5 having portions 5a and 5b are disposed on the substrate 1 so that the portions 5a and 5b of the gate electrode are interposed between the drain electrode 4 and the source electrodes 3a and 3b, respectively. Dome-shaped via-holes 6 penetrate through portions of the substrate 1 from the rear surface, opposite the respective source electrodes 3a and 3b. A back plate 7 is disposed on the rear surface of the GaAs substrate 1 and on the internal surfaces of the dome-shaped via-holes 6, partially contacting the source electrodes 3a and 3b. The back plate 7 comprises an electroplated Au layer. The GaAs FET chip 500b is mounted on the die pad 500a via AuSn solder 8. Reference numeral 9 designates a lead, numeral 10 designates an insulating ring, and numeral 11 designates a bonding wire. In this structure, the dome-shaped via-holes 6 and the back plate 7 on the internal surfaces of the via-holes 6 are for grounding the GaAs FET chip 500b and radiating heat generated in the FET chip.

FIGS. 20(a) and 20(b) are sectional views illustrating a part of the semiconductor device 500 in the vicinity of the via-hole 6 before and after the die-bonding process, respectively. In these figures, the same reference numerals as in FIGS. 19(a) and 19(b) designate the same or corresponding parts. Reference numeral 6a designates a space in the via-hole 6, and numeral 1a designates a crack produced in the GaAs substrate 1 during the die-bonding process.

In the conventional die-bonding process of a semiconductor device, AuSn solder is generally used because it has good adhesion and heat radiating properties. However, when the GaAs FET chip 500b having the via-hole 6 at the rear surface of the substrate 1 is bonded to the die pad 500a using the AuSn solder 8 which is melted by heating, the melted AuSn solder 8 enters into the space 6a of the via-hole 6 (FIG. 20(b)). When the solder 8 is cooled and hardened, a thermal stress is applied to the boundary between the solder 8 and the substrate 1 due to a difference in linear expansion coefficients between the solder and the substrate. The thermal stress causes a crack 1a in a thin part of the substrate 1 in the vicinity of the via-hole 6. This results in semiconductor devices with poor performance and reliability. In addition, the production yield is very poor.

The inventor of the present invention proposed a die-bonding method for suppressing the cracking in Published Transactions of Engineering No. 91-11870 of Japan Inventor's Society.

FIG. 21 is a sectional view schematically illustrating a part of a semiconductor device after die-bonding process for explaining the die-bonding method. In the figure, the same reference numerals as in FIGS. 20(a)–20(b) designate the same or corresponding parts. Reference numeral 3 designates an electrode pad, numeral 24 designates a plated Ni—P layer formed by electroless plating, and numeral 500c designates a semiconductor chip.

In this die-bonding method, as illustrated in FIG. 21, a part of the back plate 7 disposed on the internal surface of the via-hole 6 is covered with the electroless-plated Ni—P layer 24 which is poorly wetted by the AuSn solder. Therefore, when the semiconductor chip 500c is soldered to the die pad 500a using the AuSn solder 8, the Ni—P layer 24 prevents the AuSn solder 8 from entering in the space 6a of the via-hole 6. The electroless-plated Ni—P layer 24 is formed in the following process. That is, portions of the back plate 7 on the rear surface of the substrate 1, other than the internal surface of the via-hole 6, are masked with a resist film, followed by electroless plating.

The die-bonding method proposed by the inventor of the present invention shown in FIG. 21 significantly reduces the incidence of cracks in the vicinity of the via-hole 6, compared to the prior art die-bonding method shown in FIGS. 20(a)–20(b). However, since the electroless plating does not ensure a favorable growth of a layer on a narrow region, it is difficult to selectively grow the Ni—P layer 24 on the very narrow region of the internal surface of the via-hole 6 by electroless plating using a resist mask. In addition, resist scum produced in the photolithography for forming the resist mask adversely affects the growth of the plated film. Actually, via-holes with no Ni—P plated layers are produced at a rate of 10–20% in a wafer. Although this percentage is small, semiconductor devices with cracks in the vicinity of the via-hole are still manufactured in this prior art method.

Furthermore, in the die-bonding method shown in FIG. 21, since the electroless-plated Ni—P layer 24 disposed over the internal surface of the via-hole 6 prevents the AuSn solder 8 from entering into the via-hole, the large space 6a remains in the via-hole 6. However, in the above-described semiconductor device including the GaAs FET chip 500c or in a high-power GaAs MMIC (Monolithic Microwave IC) including a plurality of FETs, since the heat radiating property of the device significantly affects performance, the dimensions of the space 6a that reduces the heat radiating property must be held to the minimum of a range for preventing cracking in the semiconductor substrate. In the above-described die-bonding method of FIG. 21, however, the space 6a remaining inside the via-hole 6 is too large to secure a desired heat radiating property of the device.

Meanwhile, Japanese Published Patent Application No. Hei. 2-162735 discloses a die-bonding method similar to the method of FIG. 21. However, also in this prior art method, the heat radiating property of the device is not considered at all, and the space inside the via-hole remains as it is after the die-bonding process. Therefore, this method cannot solve the above-described problem.

SUMMARY OF THE INVENTION

It is an object of the present invention to provide a structure of a semiconductor device that restrains the reduction in the heat radiating property of the device to the minimum and that prevents cracks in the semiconductor substrate in the vicinity of the via-hole.

It is another object of the present invention to provide a method for producing the structure at good yield.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, in a semiconductor device comprising a conductive pad and a semiconductor chip mounted on the conductive pad via solder, the semiconductor chip includes a semiconductor substrate having opposite front and rear surfaces, a first electrode disposed on the front surface, a via-hole formed from the rear surface of the substrate and contacting the first electrode, and a second electrode covering the rear surface of the substrate and the internal surface of the via-hole and contacting the first electrode. The semiconductor chip is mounted on the conductive pad with a space between a part of the internal surface of the via-hole and the solder, and the space is prescribed so that the thermal stress caused by a difference in linear expansion coefficients between the semiconductor substrate and the solder does not exceed the rupture stress of the semiconductor substrate and the reduction in the heat radiating property of the device due to the space is held to the minimum. Therefore, a semiconductor device with improved performance and reliability in which the semiconductor substrate has no cracking is achieved.

According to a second aspect of the present invention, in the above-described semiconductor device, the space between the internal surface of the via-hole and the solder is prescribed by a distance d from the bottom of the via-hole contacting the first electrode in a direction perpendicular to the surface of the substrate, which distance d is represented by $$d = \frac{xE_2[\{\Delta T(\alpha_1 - \alpha_2)/y\} - (1/E_1)]}{1 + E_2[\{\Delta T(\alpha_1 - \alpha_2)/y\} - (1/E_1)]}$$

where x is the depth of the via-hole, y is the rupture stress of the semiconductor substrate, $E_1$ is the Young's modulus of the semiconductor the substrate, $E_2$ is the Young's modulus of the solder, $\alpha_1$ is the linear expansion coefficient of the semiconductor material, $\alpha_2$ is the linear expansion coefficient of the solder material, and $\Delta T$ is a difference between the die-bonding temperature and room temperature (25° C.).

According to a third aspect of the present invention, in the above-described semiconductor device, the second electrode comprises a plated Au layer, the solder is AuSn solder, and an electroplated Ni film poorly wetted by the AuSn solder is disposed on a part of the plated Au layer corresponding to the distance d. Therefore, the space in the via-hole is produced with high reliability, increasing the production yield.

According to a fourth aspect of the present invention, in the above-described semiconductor device, the second electrode comprises a plated Au layer, the solder is AuSn solder, and a vapor-deposited or sputter-deposited metal layer comprising Ti, Mo, Ni, or Cr is disposed on a part of the plated Au layer corresponding to the distance d. Therefore, the space in the via-hole is produced with high reliability, increasing the production yield.

According to a fifth aspect of the present invention, in the above-described semiconductor device, the second electrode comprises a plated Au layer, the solder is AuSn solder, and an electroless-plated Ni layer is disposed on a part of the plated Au layer via a Pd film.

According to a sixth aspect of the present invention, in a method for producing the above-described semiconductor device, an AuSn layer is plated on part of the second electrode of a plated Au layer to a prescribed thickness, excluding a part corresponding to the distance d. Then, the plated AuSn layer is melted, and the second electrode is adhered to the conductive pad via the plated AuSn layer. Since the plated AuSn layer extends in the via-hole leaving the space corresponding to the distance d, semiconductor devices with high performance and reliability are produced at good yield.

BRIEF DESCRIPTION OF THE DRAWINGS

FIGS. 2(a) and 2(b) are sectional views illustrating the GaAs FET chip before the die-bonding process and the semiconductor device after the die-bonding process, respectively, according to the first embodiment of the present invention.

FIG. 3 is a schematic diagram for explaining the incidence of cracks in a semiconductor substrate due to the die-bonding process.

DETAILED DESCRIPTION OF THE PREFERRED EMBODIMENTS

Figure 1A:
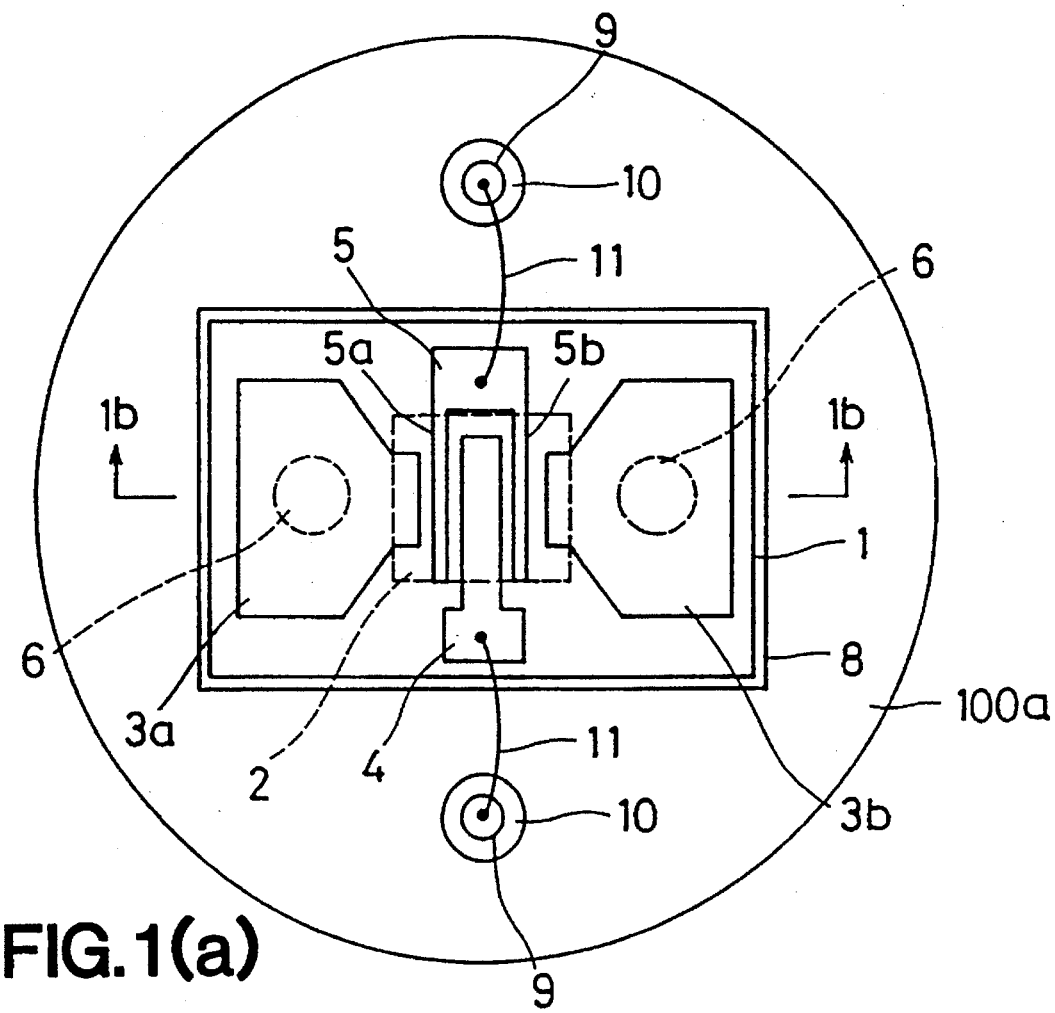
FIGS. 1(a) and 1(b) are a plan view and a sectional view, respectively, illustrating a semiconductor device including a GaAs FET chip in accordance with a first embodiment of the present invention.
Figure 1B:
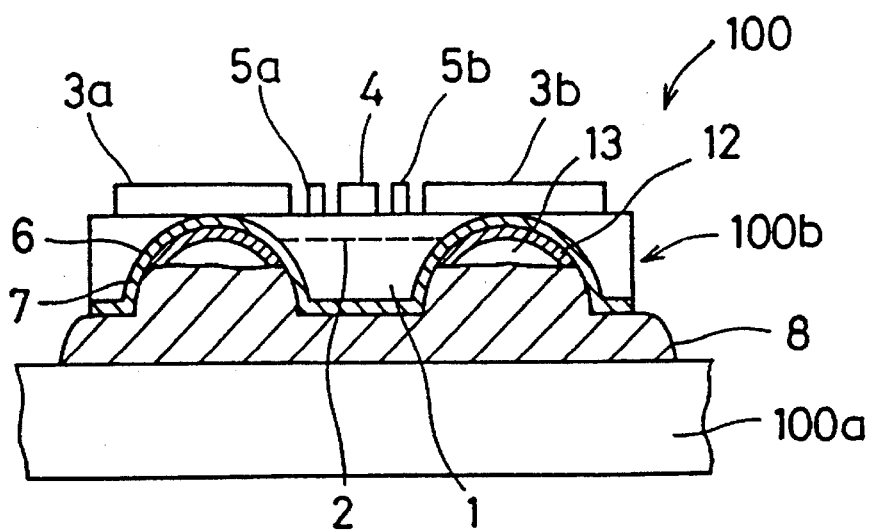
Figure 19A:
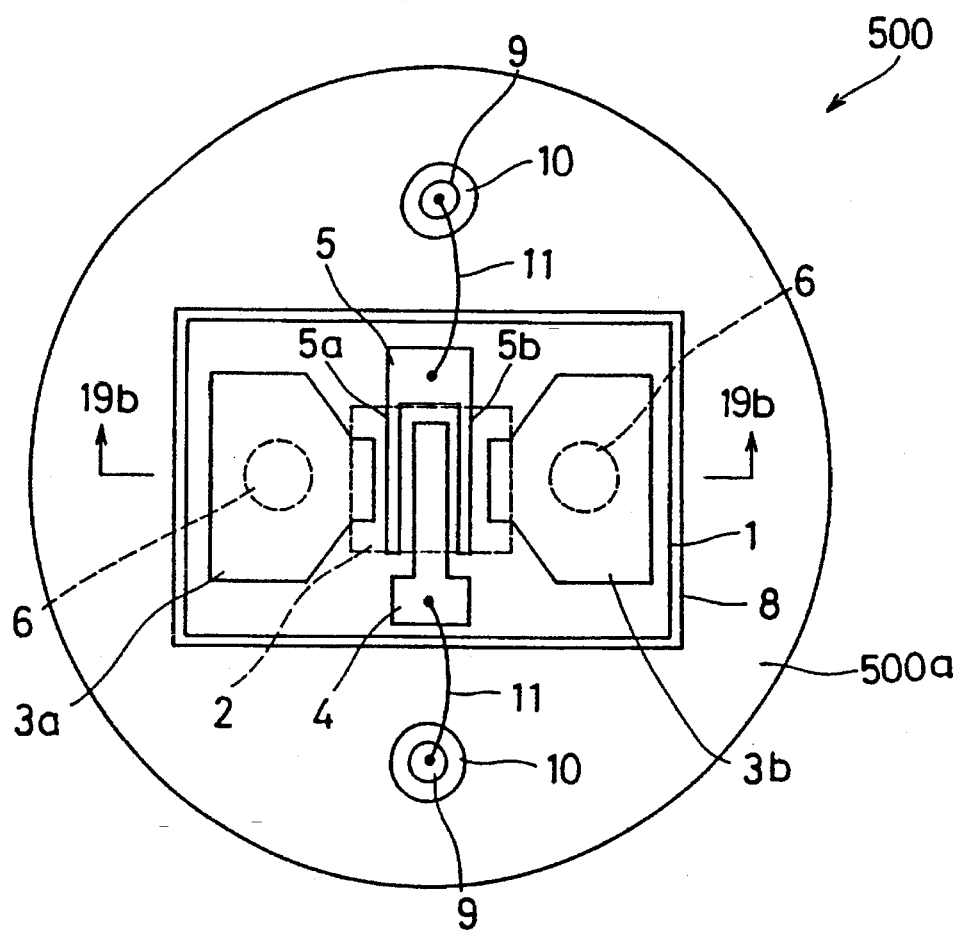
FIGS. 19(a) and 19(b) are a plan view and a sectional view illustrating a semiconductor device including a GaAs FET chip according to the prior art.
Figure 19B:
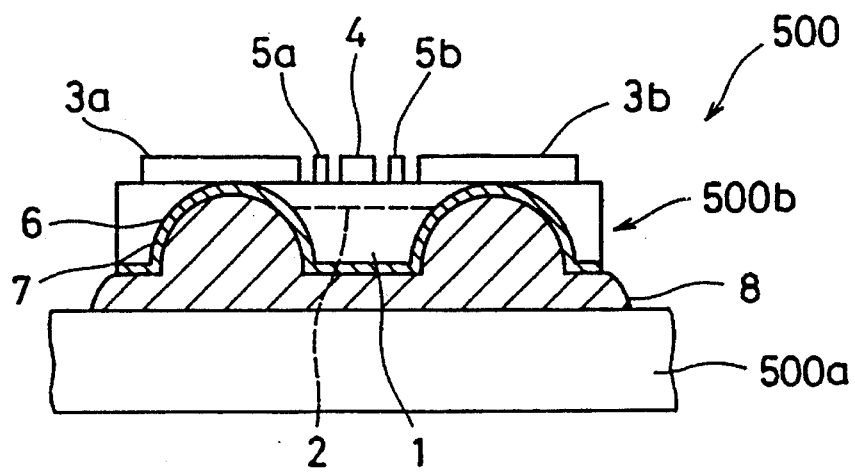
Figure 20A:
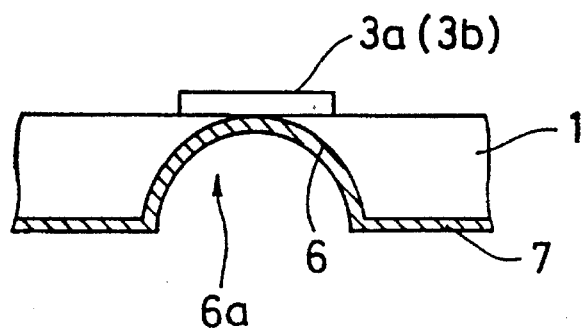
FIGS. 20(a) and 20(b) are sectional views illustrating the GaAs FET chip of FIGS. 19(a)–19(b) before the die-bonding process and the semiconductor device after the die-bonding process, respectively.
Figure 20B:
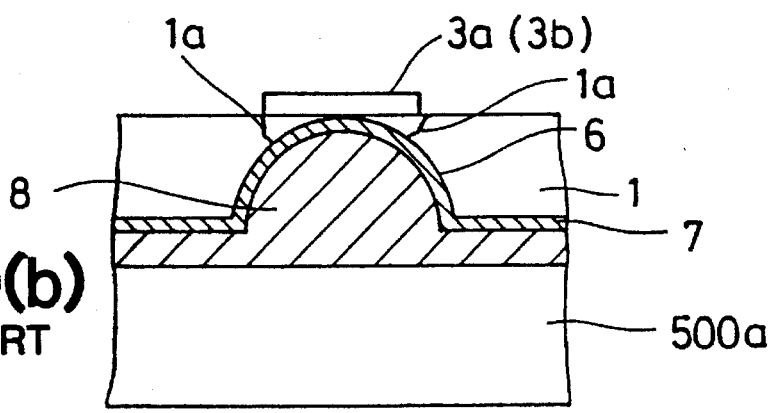

FIG. 1(a) is a plan view illustrating a semiconductor device including a GaAs FET chip in accordance with a first embodiment of the present invention, and FIG. 1(b) is a sectional view taken along line 1b—1b of FIG. 1(a). In these figures, the same reference numerals as in FIGS. 19(a)–19(b) designate the same or corresponding parts. A semiconductor device 100 comprises a die pad 100a having a surface plated with Au or the like and a GaAs FET chip 100b soldered to the die pad 100a with AuSn solder 8.

In the dome-shaped via-hole 6 of the GaAs FET chip 100b, a prescribed part of the back plate 7 on the internal surface of the via-hole 6 is covered with an electroplated Ni layer 12 that is poorly wetted by to the AuSn solder 8, whereby a space 13 is formed between the Ni layer 12 and the AuSn solder 8.

FIGS. 2(a) and 2(b) are sectional views illustrating a part of the semiconductor device 100 in the vicinity of the via-hole 6 before and after the die-bonding process, respectively. In these figures, the same reference numerals as in FIGS. 1(a)–1(b) designate the same or corresponding parts. Reference character d designates a distance from the bottom of the dome-shaped via-hole 6 contacting the source electrode 3a (3b) toward the opening of the via-hole 6 in the direction perpendicular to the substrate 1, specifying a region on the internal surface of the via-hole 6 where the electroplated Ni layer 12 is to be disposed.

In the semiconductor device 100 according to this first embodiment, the electroplated Ni layer 12 poorly wetted by the AuSn solder 8 is selectively disposed on the prescribed part of the back plate 7 in the via-hole, the invasion of the AuSn solder 8 in the via-hole 6 is stopped at the electroplated Ni layer 11 and a space 13 is produced in the via-hole 6.

The region where the electroplated Ni layer is to be disposed, i.e., the distance d, is determined as described below.

FIG. 3 is a schematic diagram for explaining the incidence of cracks in a GaAs substrate having a dome-shaped via hole in the die-bonding process. In FIG. 3, the dome-shaped via-hole 6 is filled with the AuSn solder 8. The plated Au layer 7 is ignored. In order to measure the thermal stress applied to the GaAs substrate in the vicinity of the via-hole during the die-bonding, the via-hole 6 filled with the AuSn solder and the GaAs substrate contacting the via-hole 6 are radially divided into a plurality of strips 111 with the center of the opening of the via-hole 6 as a cardinal point, as shown in FIG. 3. Each strip 111 is a bimetal comprising a GaAs layer 1a having a thickness $t_1$ and an AuSn layer 8a having a thickness of $t_2$.

Assuming that the strip 111 is not subjected to stress relaxation due to deformation, such as warping, the thermal stress ($\sigma$) produced by a difference in linear expansion coefficients between the GaAs layer 1a and the AuSn layer 8a is represented by $$\sigma = \Delta T(\alpha_1 - \alpha_2) E_1 E_2 t_2 / (t_1 E_1 + t_2 E_2) \qquad (1)$$

where $\Delta T$ is a difference (275 deg.) between the die-bonding temperature (300° C.) and the room temperature (25° C.), $\alpha_1$ is the linear expansion coefficient of GaAs, $\alpha$ is the linear expansion coefficient of AuSn solder, $E_1$ is the Young's modulus of GaAs, $E_2$ is the Young's modulus of AuSn.

The linear expansion coefficients and the Young's moduli of GaAs, Au, Sn, and AuSn are shown in the following table 1. In table 1, the linear expansion coefficient and the Young's modulus of AuSn are calculated from the linear expansion coefficients and the Young's moduli of Au and Sn on the basis of the composition ratio of AuSn (Au:Sn=8:2).

TABLE 1

| material | linear expansion coefficient [× $10^{-6}$ .°C.$^{-1}$] | Young's modulus [× $10^{11}$ dyn/cm$^2$] |
|---|---|---|
| GaAs | 6.5 | 8.53 |
| Au | 14.2 | 7.8 |
| Sn | 22.0 | 4.99 |
| AuSn | 15.8 | 7.24 |

Figure 4:
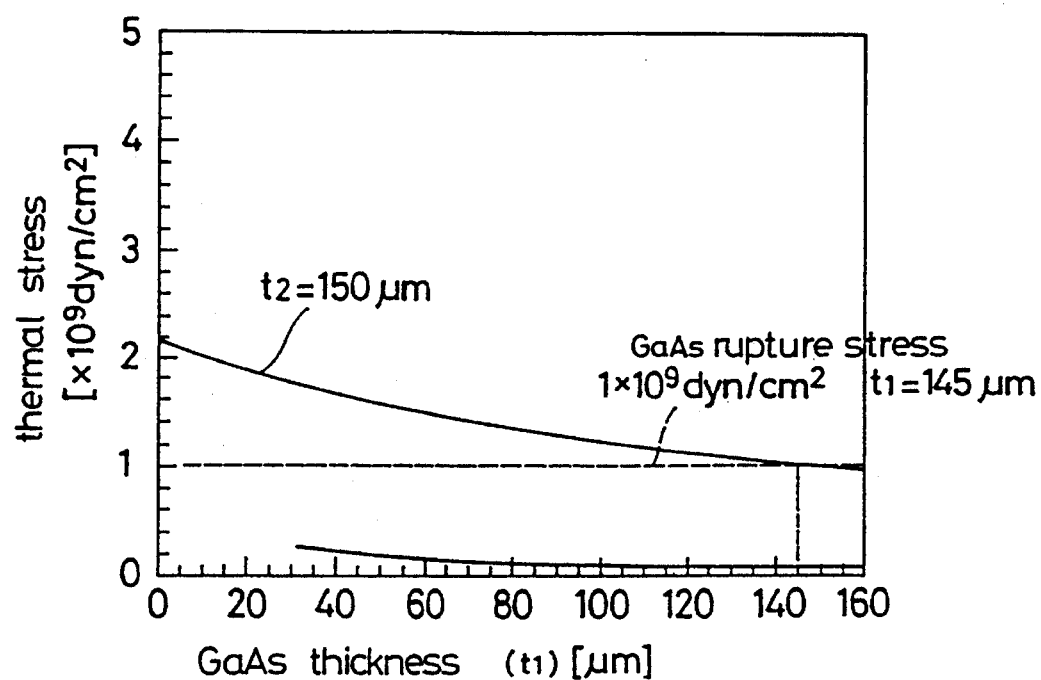
FIG. 4 is a graph illustrating the relationship between the thermal stress ($\sigma$) applied to the boundary between the via-hole and the semiconductor substrate and the thickness of the semiconductor substrate in the direction perpendicular to the via-hole during the die-bonding process.

FIG. 4 is a graph illustrating thermal stresses ($\sigma$) at various thicknesses ($t_1$) of the GaAs layer 1a of the strip 111 shown in FIG. 3, calculated according to the above-described equation (1), in case where the GaAs substrate 1 of FIG. 3 is 150 μm thick and the via-hole 6 formed in the substrate 1 is completely filled with the AuSn solder 8. The depth of the via-hole 6 is 150 μm. In the graph, the dotted line shows the threshold rupture stress ($1 \times 10^9$ dyn/cm$^2$) of a GaAs substrate damaged by grinding or the like. The thickness ($t_2$) of the AuSn layer 8a is equal to the radius of the dome-shaped via-hole 6, i.e., the depth of the via-hole.

When the dome-shaped via-hole 6 formed in the GaAs substrate 1 150 μm thick is filled with the AuSn solder 8, if the thermal stress (σ) produced by the difference in the linear expansion coefficients between GaAs and AuSn exceeds the rupture stress ($1 \times 10^9$ dyn/cm$^2$) of the GaAs substrate 1, a crack is produced in the substrate 1 in the vicinity of the boundary between the substrate and the solder. More specifically, a crack is produced in a region of the GaAs substrate 1 where the thickness $t_1$ of the GaAs layer 1a shown in FIG. 3 is smaller than 145 μm, and no crack is produced in a region where the thickness $t_1$ of the GaAs layer 1a is larger than 145 μm.

Figure 5:
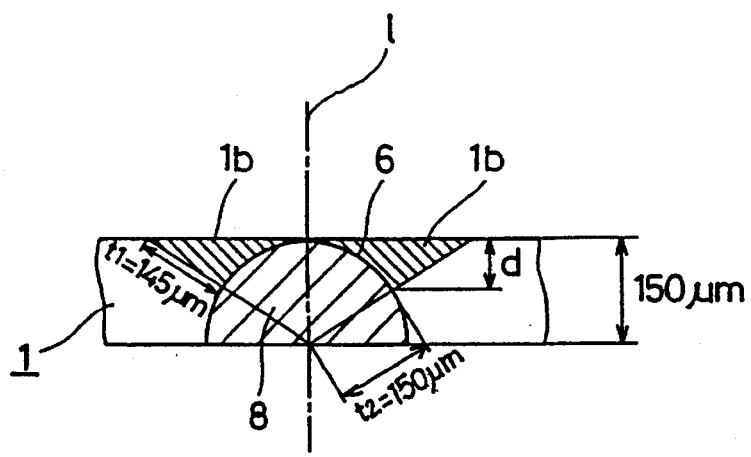
FIG. 5 is a schematic diagram illustrating a region where cracks are produced in a semiconductor substrate having a via-hole filled with solder.

In FIG. 5, the region of the substrate 1 where the crack is produced (hereinafter referred to as crack region 1b) is shown by hatching. In the crack region 1b, the thickness $t_1$ of the GaAs substrate 1 in the direction perpendicular to the surface of the AuSn solder 8 having a thickness $t_2$ of 150 μm is less than 145 μm. The distance d prescribes the upper limit of the AuSn solder 8 to be filled in the via-hole 6 from the top of the via-hole 6, i.e., the surface of the substrate 1, at which the thickness $t_1$ is 145 μm.

The right triangle bounded by the distance d, the upper surface of the substrate 1, and the thickness $t_1$ is similar to the right triangle bounded by the center line 1, the upper surface of the substrate 1, and the thickness of $t_1+t_2$. Therefore, the distance d is represented by $$d = t_1 \cdot t_2 / (t_1 + t_2) \quad (2)$$

Since $t_1$ is 145 μm and $t_2$ is 150 μm, d is 73.7 μm.

Assuming that the thickness $t_2$ of AuSn be replaced by a depth x of a via-hole, the thickness $t_1$ of GaAs be replaced by a thickness z of a semiconductor substrate in the direction perpendicular to the via-hole, and the rupture stress of the semiconductor substrate be y, following general formulae (3) and (4) are obtained from the above-described formulae (1) and (2), respectively.

$$z = xE_2[\Delta T(\alpha_1 - \alpha_2)/y - 1/E_1] \quad (3)$$

$$d = zx/(z+x) \quad (4)$$

When the formulae (3) and (4) are combined, the following general formula (5) is obtained.

$$d = \frac{xE_2[\{\Delta T(\alpha_1 - \alpha_2)/y\} - (1/E_1)]}{1 + E_2[\{\Delta T(\alpha_1 - \alpha_2)/y\} - (1/E_1)]} \quad (5)$$

where $E_1$ is the Young's modulus of the semiconductor material of the substrate, $E_2$ is the Young's modulus of the material of the solder, $\alpha_1$ is the linear expansion coefficient of the semiconductor material, $\alpha_2$ is the linear expansion coefficient of the solder material, and $\Delta T$ is a difference between the die-bonding temperature and the room temperature.

In the die-bonding process, the distance d is calculated according to the formula (5), and the semiconductor substrate is soldered to a conductive plate so that a space corresponding to the distance d remains in the via-hole, whereby a semiconductor device in which no crack is produced in the semiconductor substrate and the reduction in the heat radiating property is held to a minimum is achieved.

FIGS. 6(a)–6(d) are sectional views of process steps in a method for producing the semiconductor device shown in FIGS. 1(a)–1(b). In these figures, the same reference numerals as in FIGS. 1(a)–1(b) designate the same or corresponding parts. Reference numeral 14 designates a resist pattern.

Figure 6A:
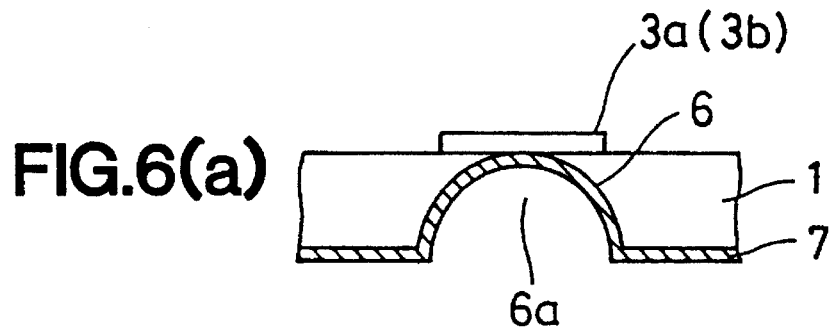
FIGS. 6(a)–6(d) are sectional views illustrating process steps in a method for producing the semiconductor device shown in FIG. 1.

Initially, a GaAs substrate 1 150 μm thick including an n type active region 2, source electrodes 3a and 3b, a drain electrode 4, and a gate electrode 5 (refer to FIG. 1(b)) is prepared. In the step of FIG. 6(a), a dome-shaped via-hole 6 is formed from the rear surface of the GaAs substrate 1 by conventional photolithography and etching techniques until the etching front reaches the source electrode 3a (3b). Then, the rear surface of the GaAs substrate 1 is subjected to an electroplating of Au, forming a back plate 7 of the plated Au layer on the rear surface of the substrate 1 and on the inner wall of the via-hole 6.

Figure 6B:
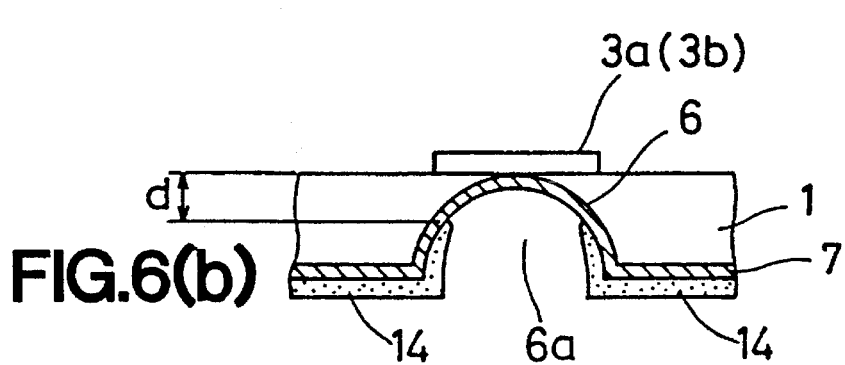

In the step of FIG. 6(b), a resist pattern 14 is selectively formed on part of the surface of the back plate 7 excluding a part prescribed by the distance d (=73.7 μm≈74 μm) calculated in the above-described formula (5), by conventional photolithographic techniques.

Figure 6C:
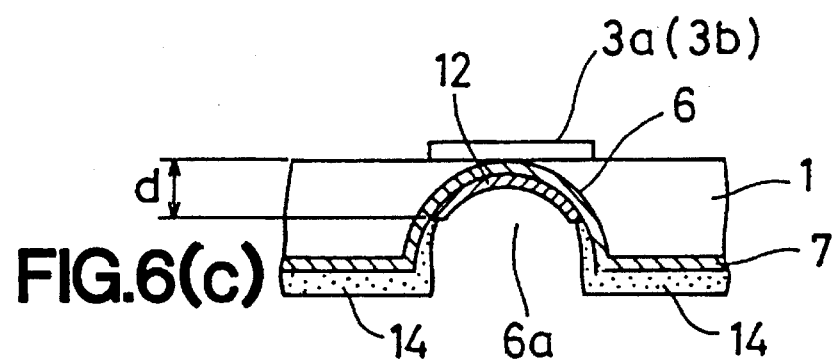
Figure 6D:
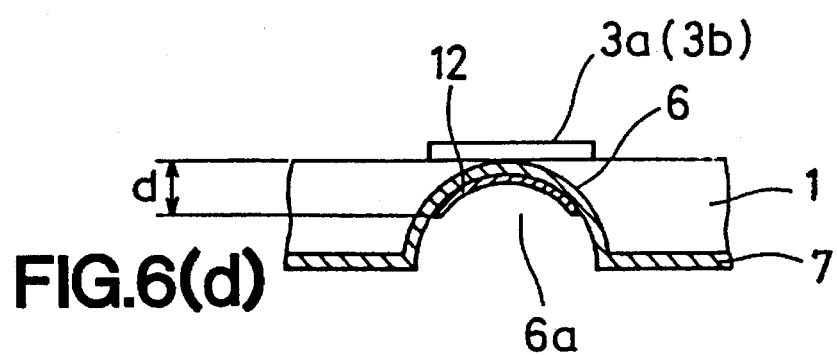

In the step of FIG. 6(c), using the resist pattern 14 as a mask, an Ni layer 12 is selectively formed on the part of the back plate 7 prescribed by the distance d using electroplating, followed by removal of the resist pattern 14, resulting in the structure of FIG. 6(d).

Thereafter, AuSn solder (Au:Sn=8:2) 8 is applied to the surface of the die pad 100a, which surface is plated with Au or the like, and the GaAs substrate 1 is soldered to the die pad 100a via the back plate 7 at the die-bonding temperature of 300° C.

In the die-bonding process, as shown in FIG. 2(b), the electroplated Ni layer 12 prevents the AuSn solder 8 from entering into the space 13 prescribed by the distance d, resulting in the semiconductor device 100 of FIG. 1(b) with the space 13 in each via-hole 6.

Figure 21:
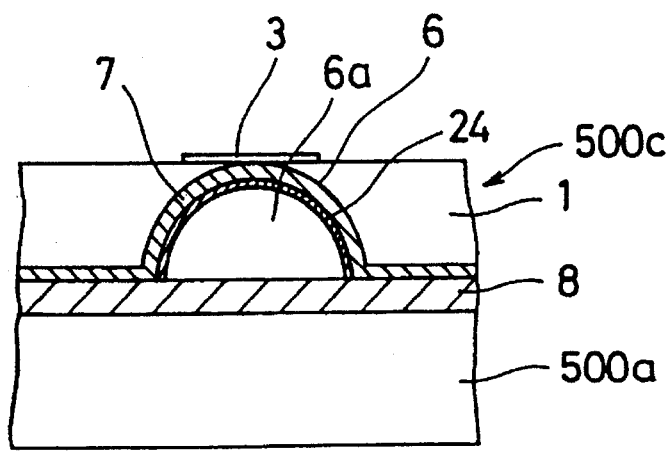
FIG. 21 is a sectional view illustrating a semiconductor device including a GaAs FET chip according to the prior art.

As described above, according to the first embodiment of the present invention, after the formation of the dome-shaped via-hole 6 at the rear surface of the GaAs substrate 1, the back plate 7 of a plated Au layer is formed on the rear surface of the substrate 1 including the internal surface of the via-hole 6, and the plated Ni layer 12 is formed on a prescribed region of the back plate 7 in the via-hole 6. The region where the plated Ni layer 12 is to be formed, i.e., the distance d shown in FIG. 2(b), is calculated in the above-described formula (5) so that the thermal stress produced by the difference in the linear expansion coefficients between the GaAs substrate 1 and the AuSn solder 8 does not exceed the rupture stress of the GaAs substrate 1. Since the plated Ni layer 12 poorly wetted by the AuSn solder 8 is present in the via-hole 6, the space 13 is formed in the via-hole 6 when the substrate 1 is soldered to the die pad 100a using the AuSn solder 8, whereby no crack is produced in the GaAs substrate 1. In addition, since the space 13 is the minimum dimension for preventing the cracking of the substrate, the heat radiating property of the device is not significantly reduced. As a result, a semiconductor device with improved performance and reliability is achieved. Furthermore, since the Ni layer 12 is formed on the back plate 7 by electroplating which is not adversely affected by the scum of the resist pattern 14 remaining on the back plate 7, the Ni layer 12 is formed with higher reliability, than the Ni—P layer 24 of FIG. 21 formed by electroless plating, whereby semiconductor devices with high performance and reliability are produced at good yield.

Figure 7:
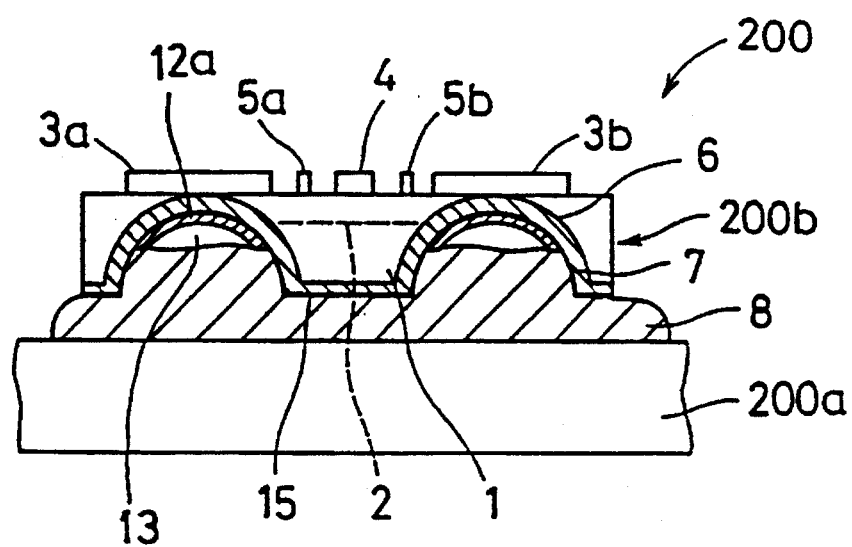
FIG. 7 is a sectional view illustrating a semiconductor device including a GaAs FET chip in accordance with a second embodiment of the present invention.

FIG. 7 is a sectional view illustrating a semiconductor device including a GaAs FET chip in accordance with a second embodiment of the present invention. In FIG. 7, the same reference numerals as in FIGS. 1(a)–1(b) designate the same or corresponding parts. A semiconductor device 200 comprises a die pad 200a having a surface plated with Au or the like and a GaAs FET chip 200b soldered to the surface of the die pad 200a with AuSn solder 8.

The semiconductor device 200 is different from the semiconductor device 100 of the first embodiment only in that a Pd (palladium) film 15 is disposed over the back plate 7 and an Ni-containing layer 12a formed by electroless plating is disposed on a part of the Pd film 15 in each via-hole 6 in place of the electroplated Ni layer 12 of the first embodiment. Preferably, the electroless-plated Ni containing layer 12a comprises Ni—P, Ni—B, or Ni—B—W. Also in this second embodiment, the region where the electroless-plated Ni-containing layer 12a is to be disposed is prescribed by the distance d (=73.7 µm) calculated in the above-described formula (5).

FIGS. 8(a)–8(d) are sectional views of process steps in a method for producing the semiconductor device 200 of FIG. 7. In these figures, the same reference numerals as in FIG. 7 designate the same or corresponding parts. Reference numeral 16 designates a resist pattern.

Figure 8A:
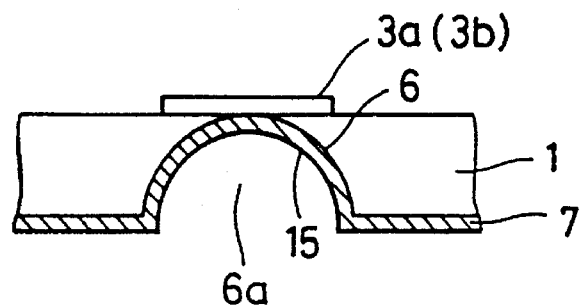
FIGS. 8(a)–8(d) are sectional views illustrating process steps in a method for producing the semiconductor device of FIG. 7.

Initially, a GaAs substrate 1 150 µm thick including the n type active region 2, the source electrodes 3a and 3b, the drain electrode 4, and the gate electrode 5 (refer to FIG. 7) is prepared. In the step of FIG. 8(a), the dome-shaped via-hole 6 is formed from the rear surface of the substrate 1, and the back plate 7 is formed on the rear surface of the substrate 1 including the internal surface of the via-hole 6. Thereafter, the back plate 7 is immersed in a solution comprising $PdCl_2$ and dilute hydrochloric acid, forming the Pd film 15 over the entire surface of the back plate 7.

Figure 8B:
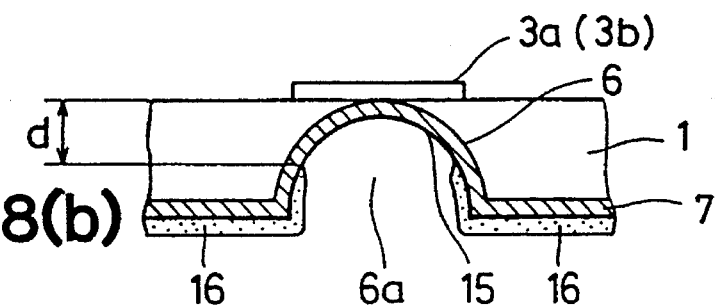

In the step of FIG. 8(b), a resist pattern 16 is selectively formed on part of the surface of the Pd film 15, excluding a part prescribed by the distance d (=73.7 µm) calculated in the above-described formula (5), by conventional photolithographic techniques.

Figure 8C:
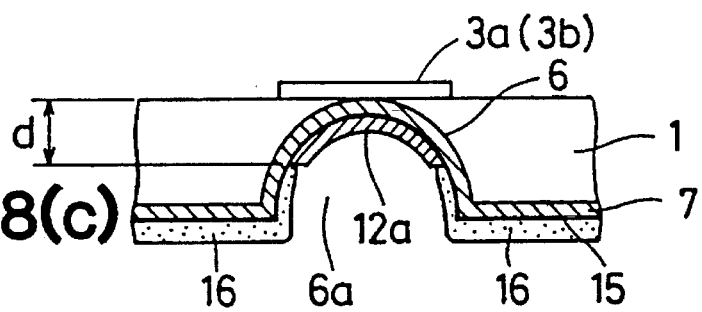
Figure 8D:
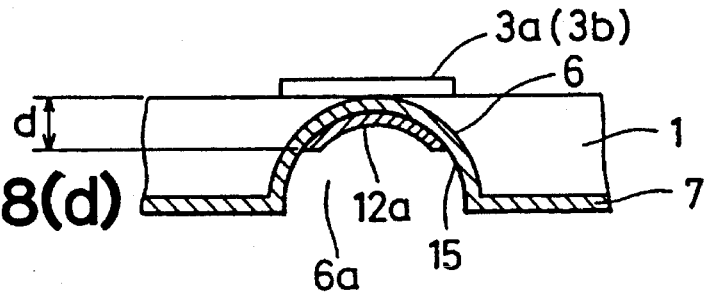

In the step of FIG. 8(c), using the resist pattern 16 as a mask, the Ni-containing layer 12a comprising Ni—P, Ni—B, Ni—B—W or the like is selectively formed on the Pd film 15 in the via-hole 6 by electroless plating, followed by removal of the resist pattern 16, resulting in the structure of FIG. 8(d).

Thereafter, the AuSn solder (Au:Sn=8:2) 8 is applied to the surface of the die pad 200a, which surface is plated with Au or the like, and the GaAs substrate 1 is soldered to the die pad 200a via the Pd film 15 at a temperature of 300° C.

In the die-bonding process, the electroless-plated Ni containing layer 12a prevents the AuSn solder 8 from entering into the space 13 corresponding to the distance d, resulting in the semiconductor device 200 of FIG. 7 with the space 13 in each via-hole 6.

As described above, according to the second embodiment of the present invention, since the electroless-plated Ni-containing layer 12a poorly wetted by the AuSn solder 8 is present in the via-hole 6, when the substrate 1 is soldered to the die pad 200a using the AuSn solder 8, the invasion of the solder into the via-hole 6 is stopped at the layer 12a, whereby the space 13 remains in the via-hole 6. Since the space 13 is prescribed by the distance d (73.7 µm) calculated in the above-described equation (5) so that the thermal stress caused by a difference in linear expansion coefficients between the GaAs substrate 1 and the AuSn solder 8 does not exceed the rupture stress of the GaAs substrate 1, no cracking is produced in the GaAs substrate 1. In addition, since the space 13 is of the minimum dimensions, the heat radiating property of the device is not significantly reduced. As a result, a semiconductor device with improved performance and reliability is achieved. Furthermore, since the electroless-plated Ni-containing layer 12a is formed on the Pd film 15 having a good adhesion to the layer 12a, the space 13 is formed in the via-hole 6 with high reliability, whereby semiconductor devices with high performance and reliability are produced at good yield.

FIGS. 9(a)–9(d) are sectional views illustrating process steps in another method for producing the semiconductor device 100 shown in FIGS. 1(a)–1(b), according to a third embodiment of the present invention. In these figures, the same reference numerals as in FIGS. 1(a)–1(b) designate the same or corresponding parts. Reference numeral 17 designates a resist pattern.

Figure 9A:
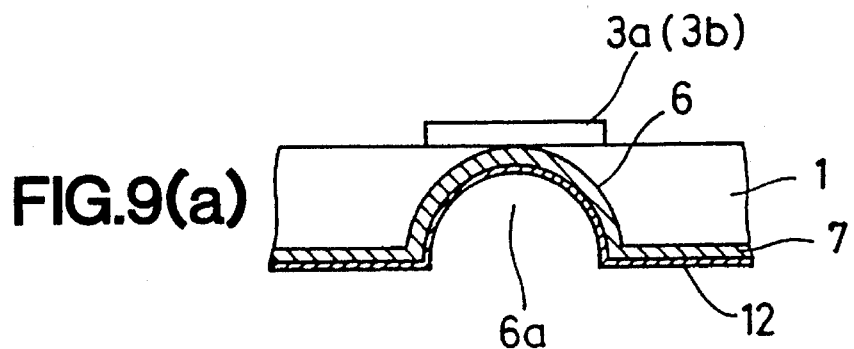
FIGS. 9(a)–9(d) are sectional views illustrating process steps in another method for producing the semiconductor device of FIG. 7 in accordance with a third embodiment of the present invention.

After the formation of the back plate 7, an Ni layer 12 is plated over the entire surface of the back plate 7 (FIG. 9(a)).

Figure 9B:
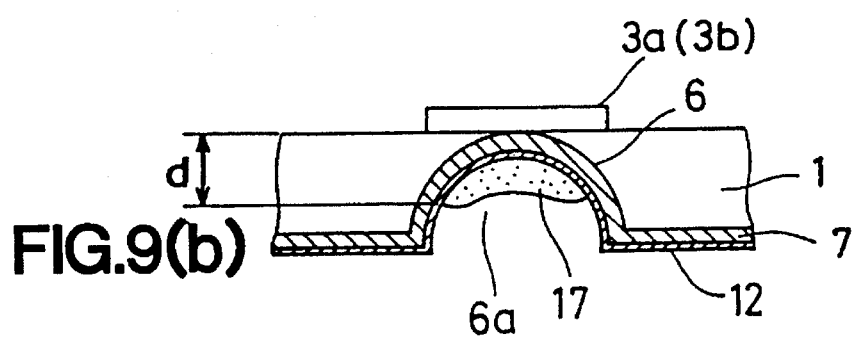

In the step of FIG. 9(b), a resist pattern 17 is formed on a region of the electroplated Ni layer 12 using conventional photolithographic techniques. The region where the Ni layer 12 is to be formed is prescribed by the distance d (73.7 µm) which is calculated in the above-described formula (5).

Figure 9C:
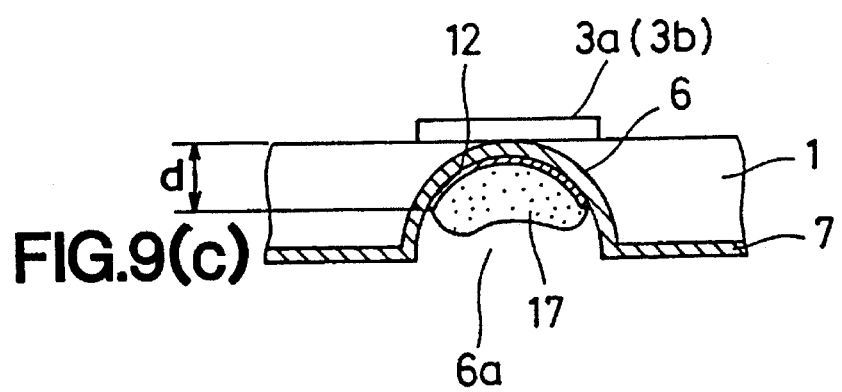
Figure 9D:
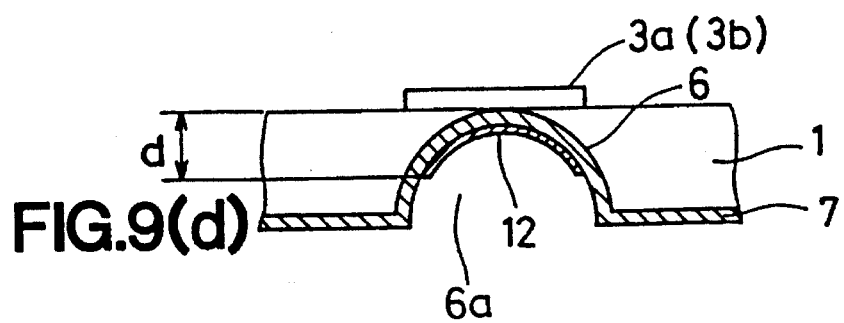

In the step of FIG. 9(c), using the resist pattern 17 as a mask, ion milling or electrolytic etching is carried out to remove portions of the plated Ni layer 12 which are not masked by the resist pattern 17, followed by removal of the resist pattern 17, resulting in the structure of FIG. 9(d).

Thereafter, as in the above-described first embodiment, the GaAs substrate 1 is soldered to the die pad 100a using the AuSn solder (Au:Sn =8:2) at 300° C. In the die-bonding process, since the electroplated Ni layer 12 poorly wetted by the AuSn solder 8 is present in the via-hole, the invasion of the AuSn solder 8 is stopped at the Ni layer 12, whereby the space 13 is produced in the via-hole 6.

Also in this third embodiment of the present invention, a semiconductor device with high performance and reliability in which the GaAs substrate has no crack and the reduction in the heat radiating property is held to a minimum is achieved. Further, since patterning of the plated Ni layer 12 is carried out after the formation of the plated Ni layer 12 over the back plate 7, the Ni layer 12 is formed on the region of the back plate 7 prescribed by the distance d with high reliability, whereby semiconductor devices with improved performance and reliability are produced at good yield.

FIGS. 10(a)–10(d) are sectional views illustrating process steps in still another method for producing the semiconductor device 100 of FIGS. 1(a)–1(b), according to a fourth embodiment of the present invention. In these figures, the same reference numerals as in FIGS. 1(a)–1(b) designate the same or corresponding parts. Reference numerals 18 and 18a designate a resist film and a resist pattern, respectively.

Figure 10A:
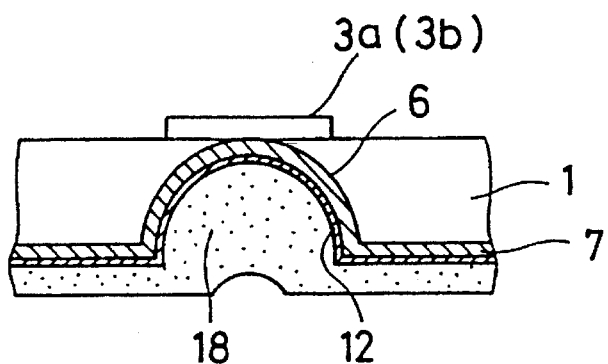
FIGS. 10(a)–10(d) are sectional views illustrating process steps in still another method for producing the semiconductor device of FIG. 7 in accordance with a fourth embodiment of the present invention.
Figure 10B:
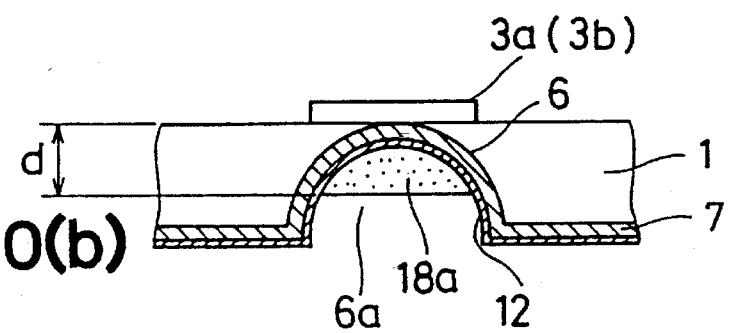
Figure 10C:
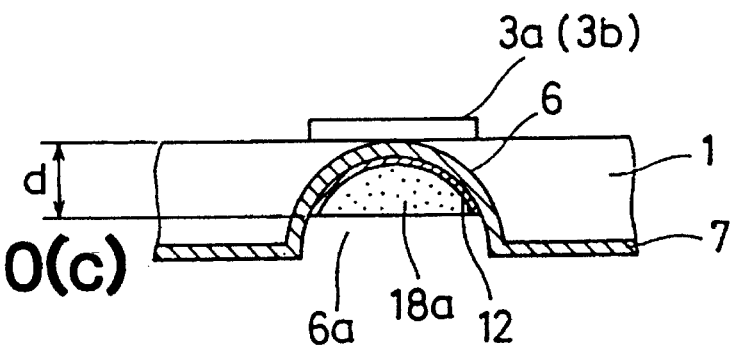
Figure 10D:
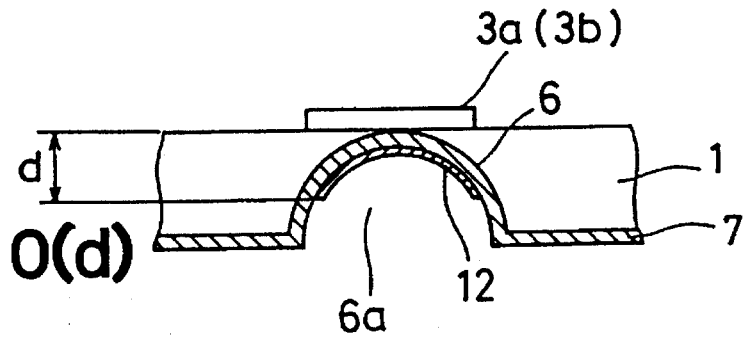

In this fourth embodiment, after the formation of the electroplated Ni layer 12 on the back plate 7, a resist film 18 is deposited over the entire surface of the substrate to completely fill the via-hole 6 with the resist film 18 (FIG. 10(a)). Thereafter, the resist film 18 is etched from the rear surface of the substrate, leaving a resist pattern 18a on a region in the via-hole 6 prescribed by the distance d (=73.7 µm) calculated in the above-described formula (5). The process steps after the formation of the resist pattern 18a are identical to those already described with respect to FIGS. 9(c)–9(d) and, therefore, do not require repeated description.

Also in the fourth embodiment of the present invention, a semiconductor device with high performance and reliability in which the GaAs substrate has no crack and the reduction in the heat radiating property is held to a minimum is achieved. Furthermore, since the resist pattern 18a is formed by etchback, the resist pattern 18a is formed on the prescribed region in the via-hole 6 with higher precision than the method according to the third embodiment, whereby the production yield is further improved.

Figure 11:
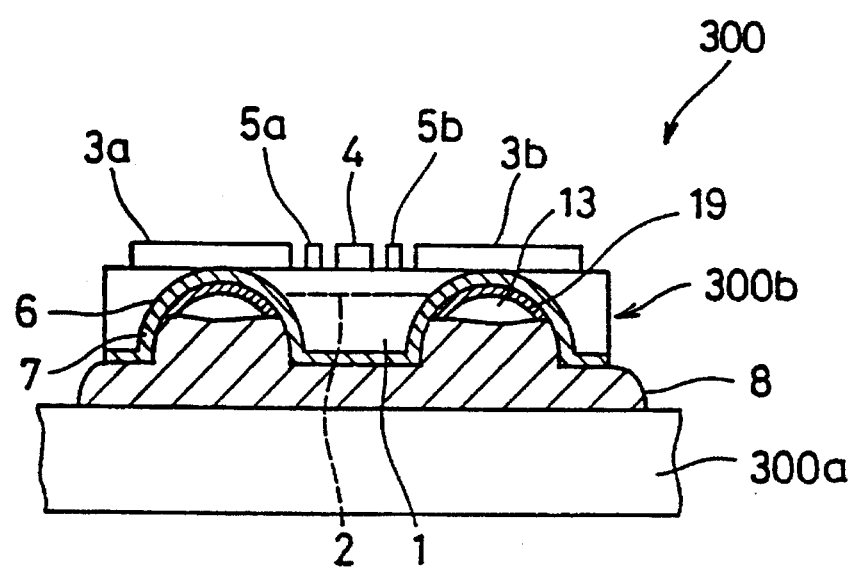
FIG. 11 is a sectional view illustrating a semiconductor device including a GaAs FET chip in accordance with a fifth embodiment of the present invention.

FIG. 11 is a sectional view illustrating a semiconductor device including a GaAs FET chip in accordance with a fifth embodiment of the present invention. In the figure, the same reference numerals as in FIGS. 1(a)–1(b) designate the same or corresponding parts. A semiconductor device 300 according to this fifth embodiment is different from the semiconductor device 100 according to the first embodiment only in that a metal layer 19 comprising Ti, Mo, Cr, or Ni and formed by vapor deposition or sputtering is employed in place of the electroplated Ni layer 12 of the first embodiment.

FIGS. 12(a)–12(d) are sectional views illustrating process steps in a method for producing the semiconductor device of FIG. 11.

Figure 12A:
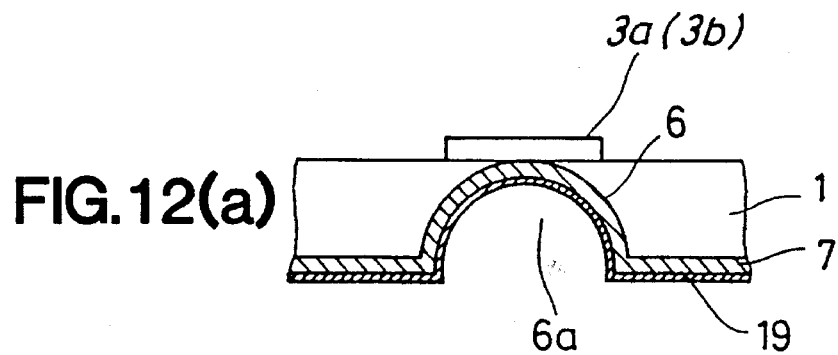
FIGS. 12(a)–12(d) are sectional views illustrating process steps in a method for producing the semiconductor device of FIG. 11.

After the formation of the back plate 7, a metal layer 19 comprising Ti, Mo, Cr, or Ni is formed over the entire surface of the back plate 7 by vapor deposition or sputtering (FIG. 12(a)).

Figure 12B:
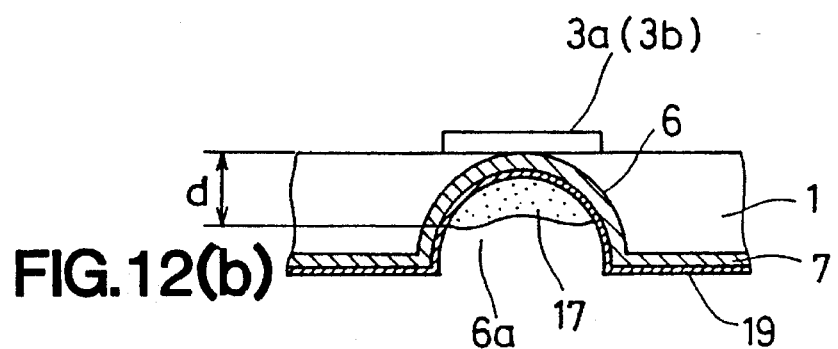

In the step of FIG. 12(b), a resist pattern 17 is formed on a region of the metal layer 19 using conventional photolithographic techniques. The region where the metal layer 19 is to be formed is prescribed by the distance d (=73.7 µm) calculated in the above-described formula (5).

Figure 12C:
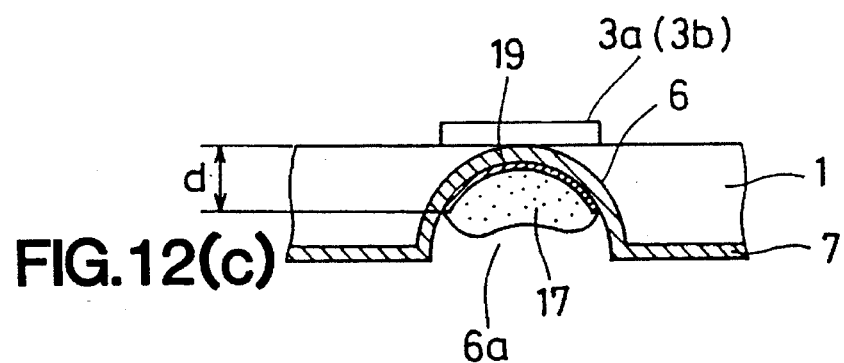
Figure 12D:
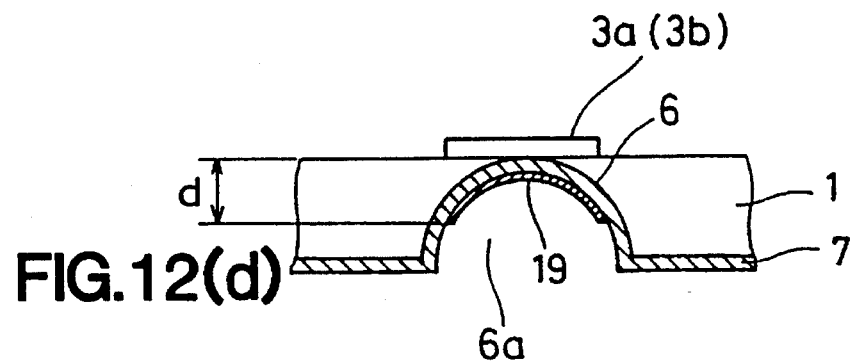

In the step of FIG. 12(c), using the resist pattern 17 as a mask, ion milling, wet etching, or electrolytic etching is carried out to remove unnecessary portions of the metal layer 12 which are not masked with the resist pattern 17, followed by removal of the resist pattern 17, resulting in the structure of FIG. 12(d).

Thereafter, similarly as in the above-described first embodiment, the GaAs substrate 1 is soldered to the die pad using the AuSn solder (Au:Sn=8:2) at 300° C. In the die-bonding process, since the vapor-deposited or sputter-deposited metal layer 19 comprising Ti, Mo, Cr, or Ni is present in the via-hole, the invasion of the AuSn solder 8 is stopped at the metal layer 19, whereby the space 13 is produced in the via-hole 6.

Also in this fifth embodiment of the present invention, a semiconductor device with high performance and reliability in which the GaAs substrate has no crack and the reduction in the heat radiating property is held to a minimum is achieved. Further, since the patterning of the metal layer 19 is carried out after the formation of the metal layer 19 over the back plate 7, the metal layer 12 is formed on the prescribed region of the back plate 7 with high reliability, whereby semiconductor devices with improved performance and reliability are produced at good yield.

FIGS. 13(a)–13(d) are sectional views illustrating process steps in another method for producing the semiconductor device 300 shown in FIG. 11, according to a sixth embodiment of the present invention. In these figures, the same reference numerals as in FIG. 11 designate the same or corresponding parts. Reference numerals 20 and 20a designate a resist film and a resist pattern, respectively.

Figure 13A:
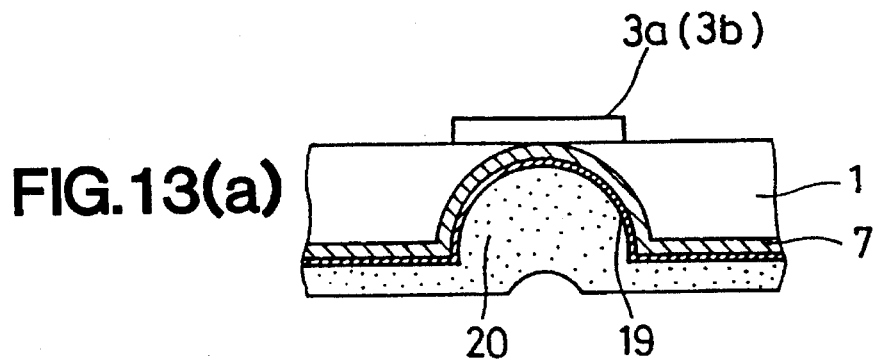
FIGS. 13(a)–13(d) are sectional views illustrating process steps in another method for producing the semiconductor device of FIG. 11 in accordance with a sixth embodiment of the present invention.
Figure 13B:
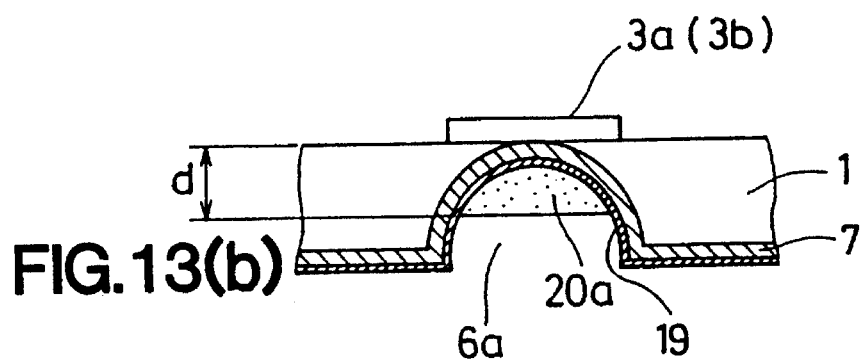
Figure 13C:
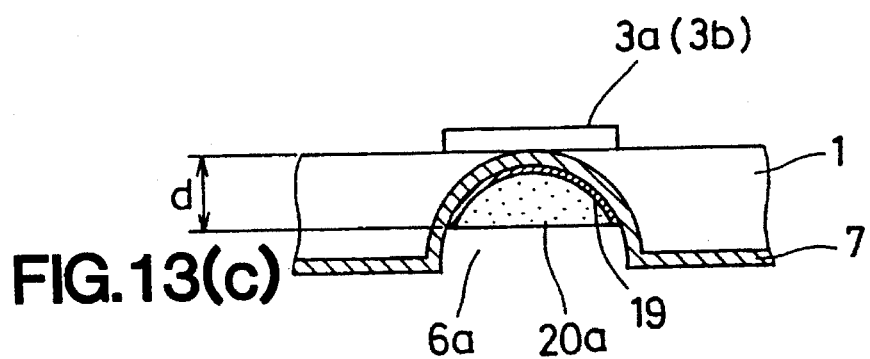
Figure 13D:
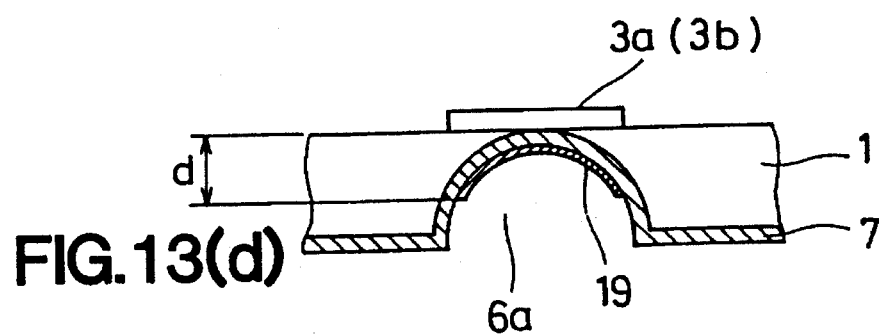

In this sixth embodiment of the present invention, after the formation of the vapor-deposited or sputter-deposited metal layer 19 comprising Ti, Mo, Ni, or Cr on the back plate 7, a resist film 20 is deposited over the entire surface of the substrate to completely fill the via-hole 6 with the resist film 20 (FIG. 13(a)). Thereafter, the resist film 20 is etched from the rear surface of the substrate, leaving a resist pattern 20a on a region prescribed by the distance d (=73.7 µm) calculated in the above-described formula (5). The process steps after the formation of the resist pattern 20a are identical to those already described with respect to FIGS. 12(c)–12(d) and, therefore, do not require repeated description.

Also in this sixth embodiment of the present invention, a semiconductor device with high performance and reliability in which the GaAs substrate has no crack and the reduction in the heat radiating property is held to a minimum is achieved. Furthermore, since the resist pattern 20a is formed by etchback, the resist pattern 20a is formed on the prescribed region in the via-hole 6 with higher precision than the method according to the fifth embodiment, whereby the production yield is further improved.

Figure 14A:
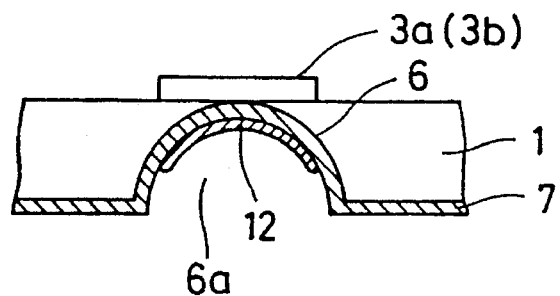
FIGS. 14(a) and 14(b) are sectional views illustrating process steps in a method for producing a semiconductor device including a GaAs FET chip in accordance with a seventh embodiment of the present invention.
Figure 14B:
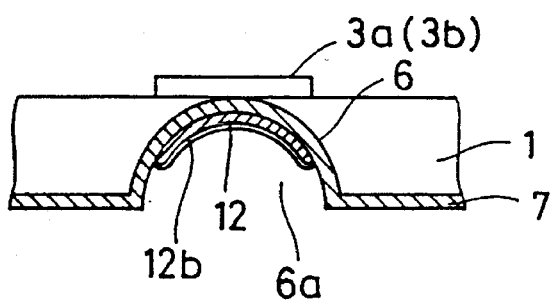

FIGS. 14(a)–14(b) are sectional views illustrating process steps in a method for producing a semiconductor device with a GaAs FET chip in accordance with a seventh embodiment of the present invention. In these figures, the same reference numerals as in FIGS. 1(a)–1(b) designate the same or corresponding parts. Reference numeral 12b designates an oxide film formed on the surface of the electroplated Ni layer 12.

After the formation of the electroplated Ni layer 12 (FIG. 14(a)), the surface of the Ni layer 12 is oxidized with oxide ash to form an oxide film 12b. Thereafter, as in the above-described first embodiment, the GaAs substrate 1 is soldered to the die pad using AuSn solder (Au:Sn=8:2).

In this seventh embodiment, since the oxide film is present at the surface of the plated Ni layer 12, the wetting of the Ni layer 12 by the AuSn solder is further decreased, whereby the space 13 in the via-hole 6 is produced with high reliability. Therefore, semiconductor devices with high performance and reliability, in which the GaAs substrate 1 has no crack and the reduction in the heat radiating property is held to a minimum, are produced at good yield.

Figure 15:
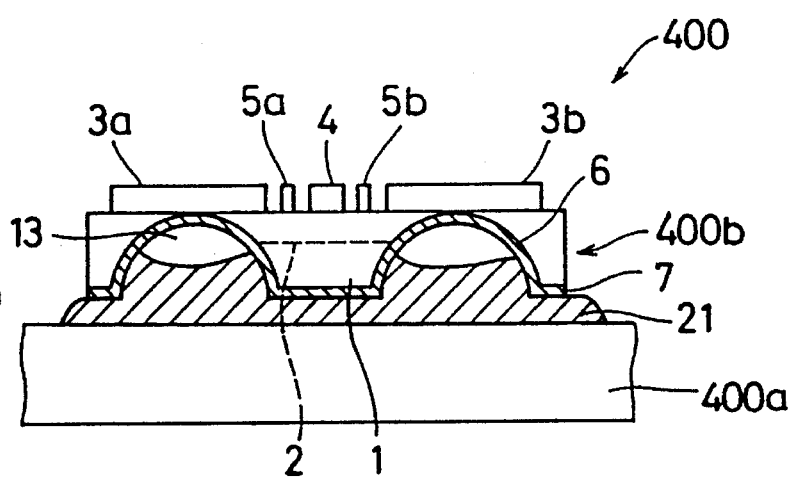
FIG. 15 is a sectional view illustrating a semiconductor device including a GaAs FET chip in accordance with an eighth embodiment of the present invention.

FIG. 15 is a sectional view illustrating a semiconductor device including a GaAs FET chip in accordance with an eighth embodiment of the present invention. In the figure, the same reference numerals as in FIGS. 1(a)–1(b) designate the same or corresponding parts. A semiconductor device 400 according to this eighth embodiment comprises a die pad 400a having a surface plated with Au or the like and a GaAs FET chip 400b mounted on the die pad 400a via a plated AuSn alloy layer 21.

In the GaAs FET chip 400b, a space 13 is formed between the internal surface of each via-hole 6 and the surface of the plated AuSn alloy layer 21.

Figure 16A:
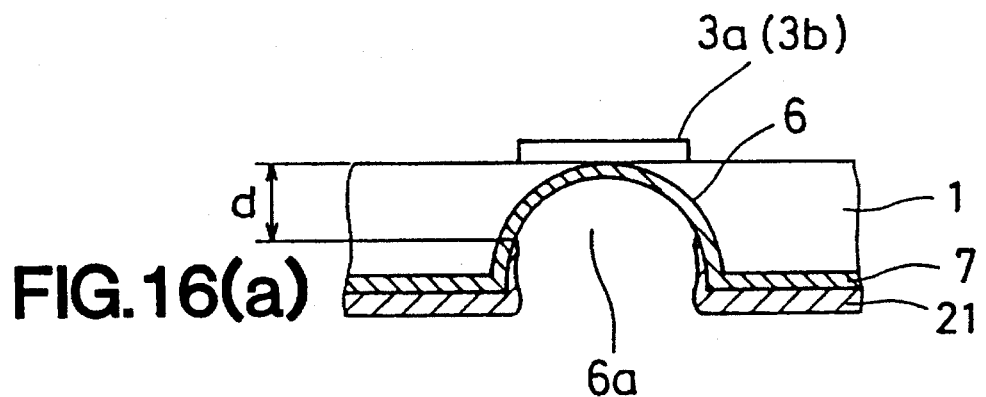
FIGS. 16(a) and 16(b) are sectional views illustrating the GaAs FET chip of FIG. 15 before the die-bonding process and the semiconductor device after the die-bonding process, respectively.
Figure 16B:
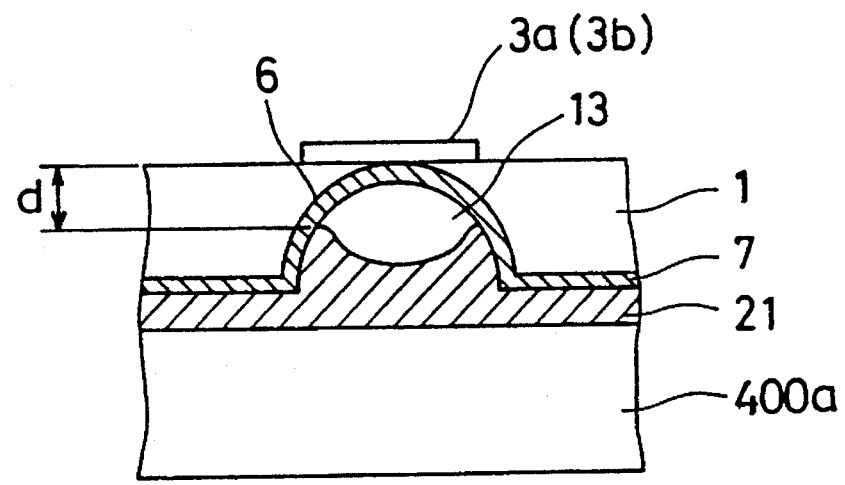

FIGS. 16(a) and 16(b) are sectional views illustrating a part of the semiconductor device 400 in the vicinity of the via-hole 6 before and after the die-bonding process, respectively. In the figures, the same reference numerals as in FIG. 15 designate the same or corresponding parts. A region of the internal surface of the via-hole 6 where the plated AuSn alloy layer 21 is to be absent is prescribed by the distance calculated in the formula (5) (d=73.7 µm).

Figure 17A:
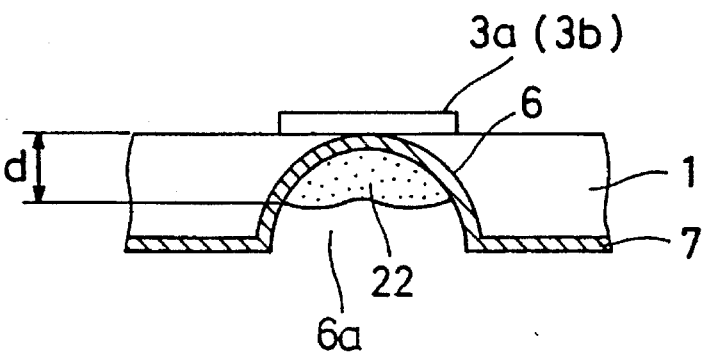
FIGS. 17(a)–17(c) are sectional views illustrating process steps in a method for producing the semiconductor device of FIG. 15.
Figure 17B:
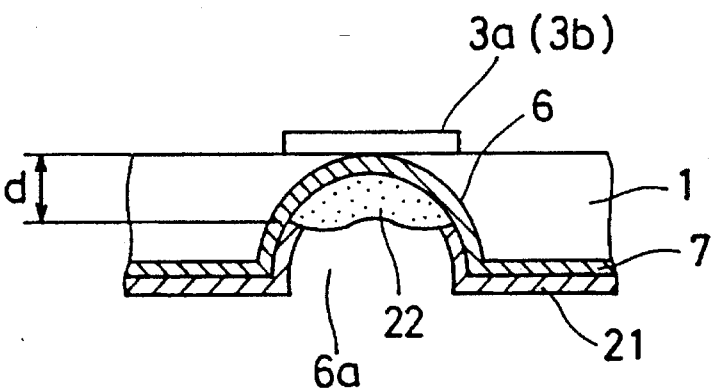
Figure 17C:
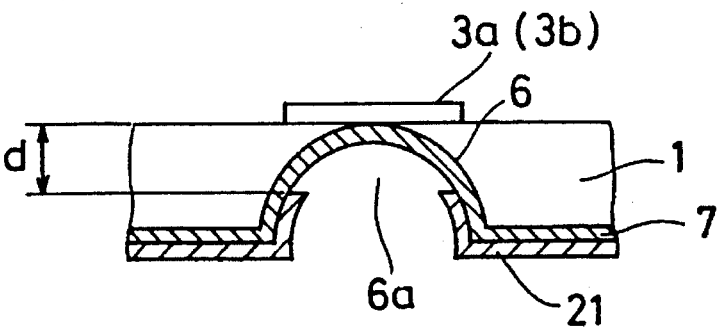

A method for producing the GaAs FET chip 400b shown in FIG. 16(a) is illustrated in FIGS. 17(a)–17(c). In these figures, the same reference numerals as in FIGS. 15 and 16(a)–16(b) designate the same or corresponding parts. Reference numeral 22 designates a resist pattern.

Initially, a GaAs substrate 1 150 µm thick including an n type active region 2, source electrodes 3a and 3b, a drain electrode 4, and a gate electrode 5 (refer to FIG. 15) is prepared. In the step of FIG. 17(a), a dome-shaped via-hole 6 is formed from the rear surface of the GaAs substrate 1 by conventional photolithography and etching techniques until the etching front reaches the source electrode 3a (3b). Then, the rear surface of the GaAs substrate 1 is subjected to electroplating of Au, forming a back plate 7 of a plated Au layer on the rear surface of the substrate 1 including the internal surface of the via-hole 6. Then, a resist pattern 22 is formed on a region of the back plate 7 in the via-hole 6 by conventional photolithographic techniques. The region is prescribed by the distance d (=73.7 μm) calculated in the above-described formula (5).

In the step of FIG. 17(c), using the resist pattern 22 as a mask, the AuSn alloy layer 21 is selectively formed on the back plate 7 to a thickness of 3–20 μm by electroplating, followed by removal of the resist pattern 22, resulting in the structure of FIG. 17(c).

Thereafter, as illustrated in FIG. 16(b), the plated AuSn alloy layer 21 is melted at 300° C., and the GaAs substrate 1 is adhered to the Au plated surface of the die pad 400a via the AuSn alloy layer 21. Since the thickness of the AuSn alloy layer 21 is selected in a range from 3 μm to 20 μm, the melted AuSn alloy does not enter into the space 13 prescribed by the distance d, resulting in the GaAs FET 400b having the space 13 in each via-hole 6 shown in FIG. 15.

As described above, according to the eighth embodiment of the present invention, when the GaAs substrate 1 is adhered to the die pad 400a via the plated AuSn alloy layer 21 whose thickness is controlled in a range from 3 μm to 20 μm, the space 13, which is prescribed by the distance d calculated in the above-described formula (5) so that the thermal stress caused by the difference in linear expansion coefficients between the GaAs substrate 1 and the AuSn alloy layer 21 does not exceed the rupture stress of the GaAs substrate 1, is left in the via-hole 6, whereby no crack is produced in the GaAs substrate 1. In addition, since the space 13 is of the minimum dimensions, the heat radiating property of the device is not significantly reduced. As a result, a semiconductor device with improved performance and reliability is achieved. Furthermore, since the thickness of the plated AuSn alloy layer 21 is easily controlled, semiconductor devices with high performance and reliability are produced with higher reproducibility than the method using the AuSn solder, whereby the production yield is further improved.

FIGS. 18(a)–18(d) are sectional views illustrating process steps in another method for producing the semiconductor device 400 of FIG. 15, according to a ninth embodiment of the present invention. In these figures, the same reference numerals as in FIG. 15 designate the same or corresponding parts. Reference numerals 23 and 23a designate a resist film and a resist pattern, respectively.

Figure 18A:
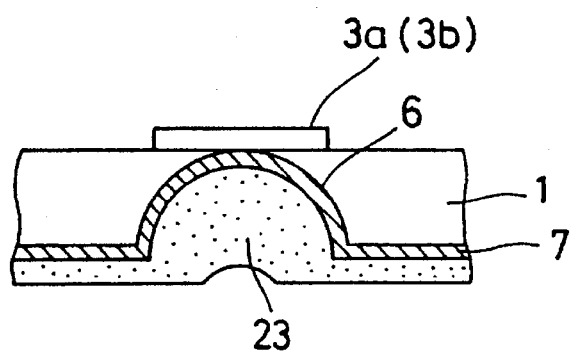
FIGS. 18(a)–18(d) are sectional views illustrating process steps in another method for producing the semiconductor device of FIG. 15 in accordance with a ninth embodiment of the present invention.
Figure 18B:
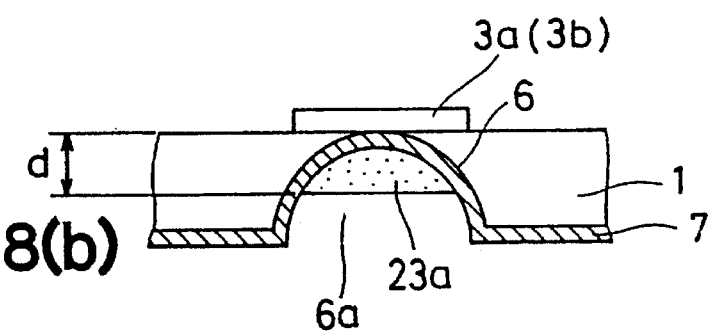
Figure 18C:
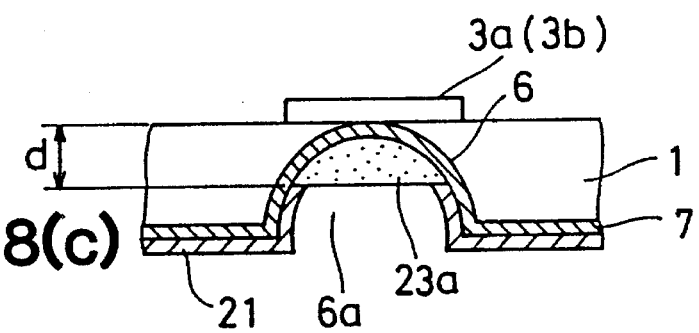
Figure 18D:
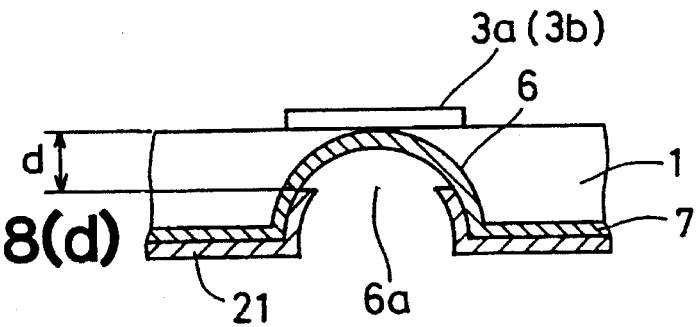

After the formation of the back plate 7, a resist film 23 is deposited over the entire surface of the back plate 7 to completely fill the via-hole 6 with the resist film 23 (FIG. 18(a)). Thereafter, the resist film 23 is etched from the rear surface of the substrate, leaving a resist pattern 23a on a region of the back plate 7 in the via-hole 6 prescribed by the distance d (=73.7 μm) calculated in the above-described formula (5). The process steps after the formation of the resist pattern 23a are identical to those already described with respect to FIGS. 17(b)–17(c) and, therefore, do not require repeated description.

Also in this ninth embodiment of the present invention, a semiconductor device with high performance and reliability in which the GaAs substrate has no crack and the reduction in the heat radiating effect is held to a minimum is achieved. Furthermore, since the resist pattern 23a is formed by etchback, the resist pattern 18a is formed on the prescribed region in the via-hole 6 with higher precision than the method according to the eighth embodiment, whereby the production yield is further improved.

While in the above-described first to ninth embodiments a semiconductor device including a GaAs FET chip is described, the present invention may be applied to other semiconductor devices including other semiconductor chips mounted on a die pad.

What is claimed is:

1. A semi-conductor device comprising:
a conductive pad; and
a semi-conductor chip including:
 a semi-conductor substrate having opposite front and rear surfaces;
 a first electrode disposed on the front surface;
 a dome-shaped via-hole having an opening at the rear surface of said substrate, an internal surface, a bottom opposite the opening and in contact with said first electrode, and a depth x from the rear surface of said substrate to said first electrode;
 a second electrode covering the rear surface of said substrate and the internal surface of the via-hole and contacting said first electrode;
 a metal layer disposed on only a part of said second electrode in the via-hole, said metal layer maintaining its shape at a die-bonding temperature and being poorly wetted by solder, the metal layer extending no farther from the front surface of said substrate than a distance d that is less than x; and
solder mounting said semi-conductor chip to said conductive pad with a void space free of solder between a part of the internal surface of the via-hole and said solder, the void space having a maximum distance, measured perpendicular to the front surface of said substrate, from the bottom of the via-hole to the solder, equal to the distance d, and represented by $$d = \frac{xE_2[\{\Delta T(\alpha_1 - \alpha_2)/y\} - (1/E_1)]}{1 + E_2[\{\Delta T(\alpha_1 - \alpha_2)/y\} - (1/E_1)]}$$

where y is rupture stress of said semi-conductor substrate, $E_1$ is Young's modulus of said semi-conductor substrate, $E_2$ is Young's modulus of said solder, $\alpha_1$ is the linear thermal expansion coefficient of said semiconductor substrate, $\alpha_2$ is the linear thermal coefficient of said solder, and $\Delta T$ is a difference between the die-bonding temperature for mounting said semi-conductor substrate on said conductive pad and room temperature.

2. The semiconductor device of claim 1 wherein said second electrode comprises an electroplated Au layer, said solder comprises AuSn, and said metal layer is an electroplated Ni layer.

3. The semiconductor device of claim 1 wherein said second electrode comprises an electroplated Au layer, said solder comprises AuSn, and said metal layer is one of a vapor-deposited and sputter-deposited metal layer selected from the group consisting of Ti, Mo, Ni, and Cr.

4. The semiconductor device of claim 1 wherein said second electrode comprises an electroplated Au layer, said solder comprises AuSn, and said metal layer is an Ni-containing layer on said second electrode and including a Pd film formed by electroless plating disposed between said second electrode and said Ni-containing layer.

* * * * *